US010270378B2

(12) United States Patent
Lamsahel

(10) Patent No.: US 10,270,378 B2
(45) Date of Patent: Apr. 23, 2019

(54) ARRANGEMENT AND METHOD FOR MONITORING A PSM-MACHINE

(71) Applicant: ZF Friedrichshafen AG, Friedrichshafen (DE)

(72) Inventor: Hassan Lamsahel, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 196 days.

(21) Appl. No.: 15/381,268

(22) Filed: Dec. 16, 2016

(65) Prior Publication Data

US 2017/0179863 A1 Jun. 22, 2017

(30) Foreign Application Priority Data

Dec. 21, 2015 (DE) .......................... 10 2015 226 382

(51) Int. Cl.
*G01R 31/28* (2006.01)
*H02P 21/22* (2016.01)
(Continued)

(52) U.S. Cl.
CPC .......... *H02P 21/22* (2016.02); *G01R 31/2829* (2013.01); *G01R 31/343* (2013.01);
(Continued)

(58) Field of Classification Search
CPC ..... G01R 31/34; G01R 31/343; G01R 31/346
See application file for complete search history.

(56) References Cited

U.S. PATENT DOCUMENTS 6,400,107 B1 * 6/2002 Nakatani ................. H02P 6/085
318/400.21
9,707,825 B2 * 7/2017 Najima .................... H02P 6/185
(Continued)

FOREIGN PATENT DOCUMENTS

DE  10206191 A1 6/2003
DE  102009034595 A1 4/2011
(Continued)

OTHER PUBLICATIONS

German Search Report dated Jul. 22, 2016 for DE 10 2015 226 382.7 (German language, 7 pages).
(Continued)

*Primary Examiner* — Tung X Nguyen
(74) *Attorney, Agent, or Firm* — Brinks Gilson & Lione

(57) ABSTRACT

A method for monitoring a PSM machine having three phases including detecting whether one or more current sensors disposed on a phase of the machine has malfunctioned. If a malfunction is detected, a voltage indicator is calculated from a voltage amplitude and a voltage phase of an input voltage of the machine in a d, q-coordinate system by two different calculations. The first calculation includes calculating the input voltage based on a phase current, target currents, and an electrical angle of the machine. The second calculation includes calculating the input voltage based on target values of a reference voltage amplitude and a reference voltage phase. The method also includes determining the voltage amplitude and the voltage phase of the input voltage of the machine and comparing the values of the respective voltage amplitudes and voltage phases from the input voltage in the first and second calculations.

20 Claims, 2 Drawing Sheets

(51) Int. Cl.
*G01R 31/34* (2006.01)
*H02P 6/16* (2016.01)
*H02P 27/08* (2006.01)
*H02P 29/028* (2016.01)
*H02P 21/18* (2016.01)

(52) U.S. Cl.
CPC ............... *H02P 6/16* (2013.01); *H02P 21/18* (2016.02); *H02P 27/08* (2013.01); *H02P 29/028* (2013.01)

(56) References Cited

U.S. PATENT DOCUMENTS

2004/0239272 A1    12/2004   Schulz et al.
2010/0064706 A1*   3/2010   Hattori .................... H02P 21/34
                                                                        62/157

FOREIGN PATENT DOCUMENTS

DE    102014224555 A1   1/2015
DE    102014224162 A1   3/2015
EP         2226929 A1   9/2010

OTHER PUBLICATIONS

English translation of p. 7 of German Office Action dated Jul. 22, 2016 for German Patent Application No. DE 10 2015 226 382.7 (2 pages).

\* cited by examiner

ARRANGEMENT AND METHOD FOR MONITORING A PSM-MACHINE

RELATED APPLICATIONS

This application claims the benefit and priority of German Patent Application DE 10 2015 226 382.7, filed Dec. 21, 2015, which is incorporated by reference herein in its entirety.

BACKGROUND

1. Technical Field

The present invention relates to a method for monitoring a PSM machine, and an assembly for monitoring a PSM machine.

Permanently excited synchronous motors, also referred to as PSM machines, are used in a motor vehicle for different purposes, e.g. steering force support, a traction drive, or other drives. A PSM machine is an induction machine, with a permanent magnet disposed on or in the rotor. The at least one stator comprises windings of three or more phases, and forms phases therefrom, distributed at an angle of 120°. The coils of the phases are distributed on a circumference about a rotational axis, in relation to which the rotor is rotatably supported relative to the stator.

2. Background Information

The state variables of the PSM machine, such as current, voltage, flux, etc. can be depicted in a three-dimensional coordinate system (U, V, W), as is shown in FIG. 1. The state variables of the machine are transformed into a coordinate system (d, q) rotating with the rotor for the regulation of the PSM machine, wherein the d-axis has the same direction as the permanent flux of the rotor, as is likewise shown in FIG. 1. The $\alpha$, $\beta$-system is the stationary two-coordinate system of the stator. By transforming the state variables into the d, q-coordinate system, the differential equations of the PSM machine are simplified, and the PSM machine can be regulated in the manner of a direct current machine. This is referred to as field oriented regulation, or FOR. With a field oriented regulation, an overall target current, which is to flow through the induction machine, is determined with respect to a rotor (flux) stationary d, q-coordinate system, such that some control or regulation processes are easier to execute, and some calculations are simplified.

Normally, electrical currents through the individual phases, usually interconnected in a star shape, are sampled. With this circuitry, the sum of the currents through the individual phases is always equal to zero. This means that the phase current through one of the phases can thus be determined from the sum of the phase currents in the other two phases. If, however, a current sensor for determining the phase current of one of the phases malfunctions, then the field oriented regulation can no longer be carried out normally with only one current sensor. With known methods, the measurement of currents is necessary for diagnosis. It may still be possible, however, to operate the machine.

BRIEF SUMMARY

For this reason, one object of the invention is to provide a possibility for monitoring the regulation behavior of a PSM machine when a current sensor malfunctions.

This object shall be achieved according to the invention through the features of claims 1 and 8. Advantageous designs are the subject matter of the dependent Claims.

In accordance with the invention, a method for monitoring a PSM machine having at least, or exactly, three phases, which are operated by means of a field oriented control, is proposed, comprising the following steps: detection of whether one or more current sensors disposed on a phase of the PSM machine have malfunctioned; when a malfunction of one or more current sensors has been detected, such that only one of the current sensors (225) remains functional, calculation of the voltage indicator from the voltage amplitude and voltage phase of the input voltage of the PSM machine in a d, q-coordinate system with two independent methods, wherein a first calculation of the input voltage is obtained in the first method, based on a phase current measured through a functioning current sensor and the target currents, as well as the electrical angle of the machine, and in the second method, a second calculation of the input voltage is obtained, based on target values of the reference voltage amplitude, and reference voltage phase. After the calculation, a determination of the voltage amplitude and the voltage phase of the PSM machine occurs, and there is a comparison to one another of the respective voltage amplitudes and voltage phases determined from the input voltage in the first and second methods.

In one design, the calculation of the voltage indicator from the voltage amplitude and the voltage phase ($\vec{U}_s$, $\Theta_{Usdq}$; $\vec{U}_{sRef}$, $\Theta_{UsdqRef}$) of the input voltage occurs in the first method, based on the phase of the current indicator $\Theta_I$ and the current indicator amplitude $\vec{I}_s$, wherein the phase of the current indicator $\Theta_I$ is calculated via the load angle $\Theta_{LastRef}$ and the electrical angle $\Theta_{el}$ of the machine from the Equations 2 and 3, described below, and the current indicator amplitude $\vec{I}_s$ is calculated as a function of the measured components of the current indicator in the U, V, W-coordinate system $I_{su}$, $I_{sv}$, or $I_{sw}$, in accordance with the Equations 4 to 6, described below.

As a result of the voltage-dependent monitoring of the regulation behavior of the PSM machine, an effective monitoring of the machine can be achieved, even when a current sensor malfunctions, in a manner different from that of other methods, in which a malfunction of a current sensor, as described above, makes it impossible to further monitor the machine. Furthermore, significant savings can be obtained through the method, because only two current sensors are required for monitoring the regulation behavior, even if one of them malfunctions.

In one design, the comparison of the two determined voltage indicators occurs through subtraction of the values determined in the first and second calculations for voltage amplitudes and voltage phases. Advantageously, an evaluation occurs to determine the error when a deviation between the values has been detected. Advantageously, at least one measure, comprised of sending an error signal, shutting down the machine, or modifying the machine parameters, occurs, based on the detected error.

By providing two voltage indicators obtained by different methods, deviations from the normal state of the machine can be detected in a simple manner, e.g. by subtraction, and evaluated, and measures may be taken to eliminate the error. The manner of evaluation, for determining the error, depends thereby on the application. The specific error can be determined through averaging, integration, or other methods for error detection. The measures that are to be taken depend on the application, type and significance of the error, and is determined by a person skilled in the art.

In another design, the target values of the reference voltage amplitude and the reference voltage phase are calculated in the second calculation from a previous sampling step, and the intermediate circuit voltage. In another design, the voltage amplitude and the voltage phase for the first and second calculation are obtained through transformation of the d, q-components of the input voltage into the polar depiction.

Through use of known machine parameters and clever mathematical calculations and transformations, the voltage indicator can be calculated, or determined, in a simple and inexpensive manner. As a result of the simplicity of the calculation, the safety of the system is increased, and fewer complex devices, or method steps, respectively, are required in order to obtain reliable values for monitoring the machine.

In the scope of the present invention, an assembly for monitoring a PSM machine is also provided, having at least, or exactly, three phases, which are operated by means of a field oriented control, comprising at least one current sensor disposed at each phase of the PSM machine, which is configured for measuring the phase current of the phase, a means for detecting the machine angle, and a sampling device for sampling the phase current of at least one phase. Furthermore, a device for executing the method described above and an error detection device are provided, the error detection device being configured to detect a malfunction of a current sensor, or to detect that only one current sensor is still functioning, and to set the voltage indicator for the first calculation, such that the current phase of one of the other current sensors is used.

In one design, the device for executing the method comprises a device for carrying out the first calculation of the voltage indicator of the input voltage of the PSM machine, a device for carrying out the second calculation of the voltage indicator of the input voltage of the PSM machine, a comparison device, which is configured to compare the respective voltage indicators calculated in the first and in the second calculation from measured phase currents and target values. Preferably, the device also comprises an evaluation device for determining a detected error.

The advantage with the provision of the assembly is that both numerous hardware components, as well as a single component, e.g. a microchip, on which the individual method steps are implemented, e.g. as software, may be used. Furthermore, the assembly and its designs have the same advantages as those described above for the method. A voltage-based monitoring of the regulation behavior of a PSM machine is provided, by means of which numerous negative effects can be detected, and corresponding measures may be taken. This results in a higher safety level of the system, lower costs, and the possibility of monitoring numerous negative effects in a simple manner.

Further features and advantages of the invention can be derived from the following description of exemplary embodiments of the invention, based on the figures in the drawings, which show details of the invention, and from the claims. The individual features and advantages of the invention can be implemented in and of themselves, or in numerous arbitrary combinations in a variation of the invention.

BRIEF DESCRIPTION OF THE DRAWINGS

Preferred embodiments of the invention shall be described below in greater detail, based on the attached drawings.

DETAILED DESCRIPTION OF THE DRAWINGS AND THE PRESENTLY PREFERRED EMBODIMENTS

In the following description of the drawings, identical elements and functions are provided with the same reference symbols.

Figure 1:
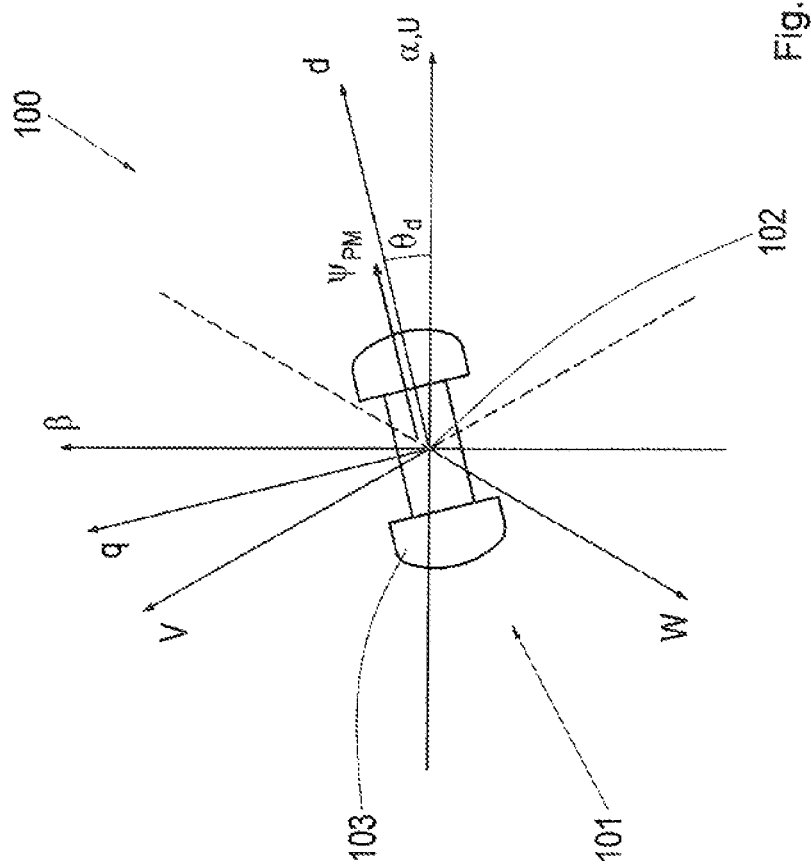
FIG. 1 shows an induction machine having different coordinate systems.

FIG. 1 shows a known induction machine 100, in particular a PSM machine, comprising a stator (not shown) and a rotor 101, which are rotatably supported relative one another with respect to a rotational axis 102. At least three coils are evenly distributed at 120° intervals on the stator around a circumference about the rotational axis 102. Three phases U, V, and W are provided. Each of the phases U, V, W is normally connected to the same number of coils, which are distributed about the circumference at a uniform spacing. The number of pole pairs and the associated number of coils can be selected depending on the application. Preferably at least one permanent magnet 103 is disposed on the rotor 101, wherein a rotational torque is generated when the phases U, V, W are activated with phase-shifted alternating currents, which rotates the rotor 101 about the rotational axis 102 with respect to the stator.

A phase-shifted activation of the phases U, V, W can be depicted in different coordinate systems. In a stationary stator U, V, W-coordinate system, the coordinate axes are rotated 120° in relation to one another. Because the currents of the phases U, V, W add up to zero, a current indicator, or current vector $\vec{I}_s$ can also be depicted in a stationary stator, two-dimensional α/β-coordinate system. Furthermore, a stationary rotor d, q-coordinate system is provided in FIG. 1, the d-component of which runs in alignment with the magnetic flux $\Psi_{PM}$ of the permanent magnet 103. A q-component runs perpendicular thereto. An angle between the d-axis and the α- or U-axis corresponds to an electrical rotational angle $\Theta_d$ or $\Theta_{el}$ of the induction machine between the rotor 101 and the stator. An electrical rotational angle $\Theta_d$ or $\Theta_{el}$ corresponds to the mechanical rotational angle multiplied with the number of pole pairs.

Figure 2:
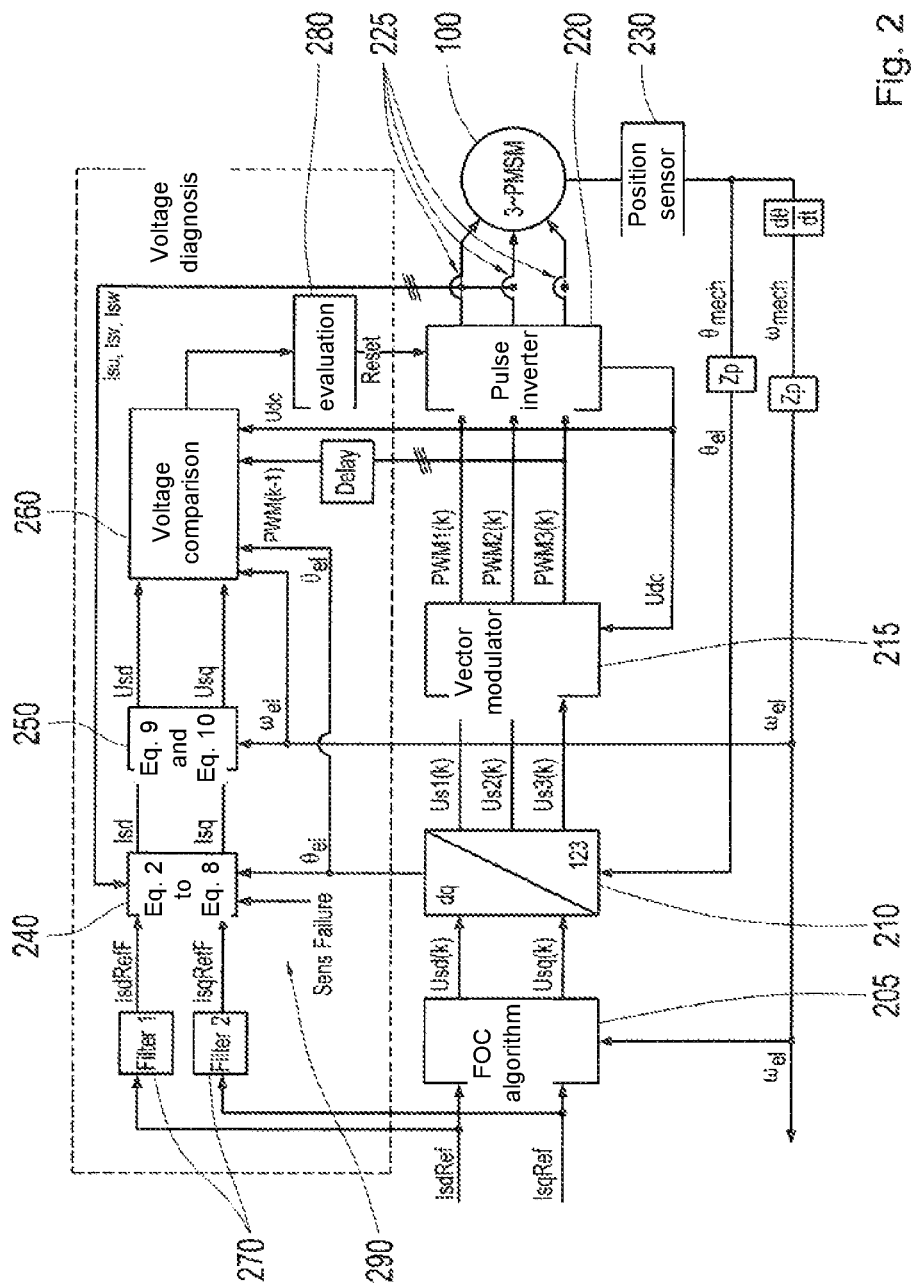
FIG. 2 shows a structural image of an assembly according to one design of the present invention.

FIG. 2 shows a structural image of an assembly for field oriented control FOC of an induction machine 100 in accordance with a design of the present invention. Normally, the field oriented regulation FOR is used for the activation of a PSM machine. In order to compensate for the reciprocal effects of the two axes d and q, decouplings may be inserted. A current sensor 225 is used for the current measurement in each phase, or at least in two of the phases. In the automotive industry, frequently only two current sensors are used, in order to reduce costs. The third phase is calculated from these two currents in accordance with Equation 1.

$$I_{sw}=I_{su}-I_{sv} \quad \text{(Equation 1)}$$

If a current sensor malfunctions, or only one current sensor is still functional, then the FOC shown in FIG. 2 is switched to. An FOC is depicted schematically in the region in FIG. 2 not lying within the box indicated by a broken line. A control component 205 generates an overall target current for the induction machine 100 d- and q-components $U_{sd(k)}$, and $U_{sq(k)}$ of a voltage, based on given d- and q-components $I_{sdRef}$, $I_{sqRef}$. The d- and q-components $I_{sdRef}$, $I_{sqRef}$ span a current vector corresponding to the overall target current. The voltage generated in the control component 205 and expressed by the d- and q-components $U_{sd(k)}$, $U_{sq(k)}$ is converted by means of a converter 210 from the d, q-coordinate system into a three-dimensional coordinate system, in particular the U, V, W-coordinate system. Three voltages $U_{s1(k)}$, $U_{s2(k)}$, $U_{s3(k)}$ are obtained thereby, which are converted by means of a vector modulator 215 into three corresponding pulse-width modulation signals $PWM_{1(k)}$, $PWM_{2(k)}$, $PWM_{3(k)}$ based on an intermediate circuit voltage $U_{dc}$. The intermediate circuit voltage $U_{dc}$ can correspond to an on-board voltage or a battery voltage when used in a motor vehicle. A pulse inverter 220 is configured to connect each of the phases U, V, W in an alternating manner to a high and low potential of the intermediate circuit voltage $U_{dc}$, such that a desired voltage is set for the phases U, V, W. The applied voltages result in actual phase currents $I_{su}$, $I_{sv}$, $I_{sw}$, through the phases U, V, and W. At least one actual phase current $I_{su}$, $I_{sv}$, $I_{sw}$ is sampled by means of a sampling device 225, which also comprises current sensors.

Aside from the induction machine 100, the pulse inverter 220, the sampling device, or the current sensor(s) 225 and the position sensor 230, the depicted elements, or blocks are normally executed as method steps of a method, which runs on a processor, which preferably comprises a programmable microcomputer. Incoming signals are normally sampled by means of analog/digital converters, and signals that are to be output are output digitally by means of a driver module, or in analog form by means of a digital/analog converter. In this regard, the control device can also be regarded as the depiction of a method.

In order to ensure a monitoring of the PSM machine, even when one of the current sensors 225 has malfunctioned, an expansion of the induction machine 100 is proposed, as can be seen in FIG. 2, which is depicted in the upper region of FIG. 2 in a box indicated by a broken line. The functional components for monitoring depicted herein, and described in greater detail below, can be selectively implemented as method steps, which are executed on a processor, or as devices, which execute, in particular, a signal processing based on currents and voltages.

In principle, the monitoring of the regulation behavior of the PSM machine occurs in that the measured phase current of the phase still having a functioning current sensor 225 is used for the calculation of the input voltage of the machine, and this is compared with the target voltage, or the reference voltage, respectively, of the machine. This means that the PSM machine is monitored via a voltage diagnosis when a current sensor malfunctions, unlike with previously proposed methods, such that negative effects that can simultaneously be detected via the voltage, e.g. short circuits in the machine, angular errors in the position sensor or large parameter fluctuations are detected, and appropriate corrective measures can be implemented.

A monitoring of the machine when a current sensor malfunctions, based on the calculation of the input voltage of the machine in a d, q-coordinate system via two different methods is proposed. The results of the two calculations are compared thereby, and evaluated. Both calculations shall be described in detail below.

The first calculation of the input voltage of the machine occurs via measurement variables of the machine, in this case the machine current and the machine rotational rate, as well as via known machine parameters, as described below.

With a current sensor malfunction, at least one of the two current sensors 225 continues to function, such that the phase current of this phase can still be measured therewith. This means that at least one component of the phase current indicator is available in the U, V, W-coordinate system. The other two components of the current indicator can be determined in the U, V, W-coordinate system from these measured individual components, the current indicator and the target currents $I_{sdRef}$ and $I_{sqRef}$, such that a calculation of the machine voltage can be executed in the d, q-coordinate system. For this, the electrical angle $\Theta_{el}$, for example, determined by the position sensor 230, is used in addition to the two d- and q-target current values $I_{sdRef}$ and $I_{sqRef}$.

Because the FOC has a selected dynamic, i.e. the required d, q-currents are first set after a certain time, this offset is normally reproduced via a filter 270, e.g. a low pass filter, or other suitable filter. Time constants of the filter 270 may differ from one another, wherein they are preferably selected such that the dynamics of the FOC are reproduced, i.e. most of the target currents filtered in the filter have the same curve as the currents in the machine. As a result of the offset target values of the d, q-currents $I_{sdRefF}$ and $I_{sqRefF}$, the reproduced phase currents of the machine, transformed into the d, q-coordinate system, can be retained, as described below. The equations are executed by appropriate devices, as shown in FIG. 2, and can also be executed as pure method steps, as described above.

Equation 2 shows how the load angle of the machine $\Theta_{Last\ Ref}$ is calculated from the filtered currents $I_{sdRefF}$ and $I_{sqRefF}$.

$$\Theta_{Last\ Ref} = \arctan \frac{IsqRefF}{IsdRefF} \qquad \text{(Equation 2)}$$

The phase of the current indicator $\Theta_I$ can be calculated via the load angle $\Theta_{Last\ Ref}$ and the electrical angle $\Theta_{el}$ of the machine:

$$\Theta_I = \Theta_{el} + \Theta_{Last\ Ref} \qquad \text{(Equation 3)}$$

For the calculation of the amplitude of the current indicator, the measured components of the current indicator in the U, V, W-coordinate system, $I_{su}$, $I_{sv}$, or $I_{sw}$, and the calculated phase of the current indicator $\Theta_I$ from Equation 3 are used. Three different equations are to be distinguished thereby, depending on the measured components of the current indicator in the U, V, W-coordinate system.

If the current is measured in the Phase U, the amplitude of the current indicator is calculated from the following equation:

$$\|\vec{I}_s\| = \frac{Isu}{\cos(\Theta_I)} \qquad \text{(Equation 4)}$$

If the current in Phase V is measured, the amplitude of the current indicator is calculated from the following equation:

$$\|\vec{I}_s\| = \frac{Isv}{\cos\left(\Theta_I + \frac{4\pi}{3}\right)} \qquad \text{(Equation 5)}$$

If the current in Phase W is measured, the amplitude of the current indicator is calculated from the following equation:

$$\|\vec{I}_s\| = \frac{Isw}{\cos\left(\Theta_I + \frac{2\pi}{3}\right)} \qquad \text{(Equation 6)}$$

It should be noted that the calculations from Equations 4 to 6 cannot be calculated with a denominator equal to zero, such that no calculation for a bandwidth close to the zero denominator is calculated. As to how close to zero a calculation is no longer executed depends thereby on the available computing power and the application, and is decided accordingly by a person skilled in the art.

The current components $I_{s\alpha}$ and $I_{s\beta}$ in the $\alpha$, $\beta$-coordinate system are obtained via the phase calculated in Equation 3 and the amount for the current indicator calculated in the Equations 4, 5 or 6:

$$\begin{pmatrix} I_{s\alpha} \\ I_{s\beta} \end{pmatrix} = \begin{pmatrix} \cos\Theta_I \\ \sin\Theta_I \end{pmatrix} \cdot \|\vec{I}_s\| \quad \text{(Equation 7)}$$

From the two calculated current components $I_{s\alpha}$ and $I_{s\beta}$, the d, q-current components of the machine $I_{sd}$ and $I_{sq}$ can be calculated as follows:

$$\begin{pmatrix} I_{sd} \\ I_{sq} \end{pmatrix} = \begin{pmatrix} \cos\Theta_{el} & \sin\Theta_{el} \\ -\sin\Theta_{el} & \cos\Theta_{el} \end{pmatrix} \cdot \begin{pmatrix} I_{s\alpha} \\ I_{s\beta} \end{pmatrix} \quad \text{(Equation 8)}$$

By inserting the calculated currents $I_{sd}$ and $I_{sq}$ from Equation 8, the voltages of the machine can be calculated by means of differential equations for the machine in the d, q-coordinate system:

$$U_{sd} = R_s \cdot I_{sd} + L_{sd} \cdot \frac{dI_{sd}}{dt} - \omega_{el} \cdot L_{sq} \cdot I_{sq} \quad \text{(Equation 9)}$$

$$U_{sq} = R_s \cdot I_{sq} + L_{sq} \cdot \frac{dI_{sq}}{dt} - \omega_{el} \cdot L_{sd} \cdot I_{sd} + \omega_{el} \cdot \psi_{PM} \quad \text{(Equation 10)}$$

The voltage amplitude U, and the voltage phase $\Theta_{Usdq}$ of the machine in the d, q-coordinate system are obtained through transformation of the two d, q-components from Equations 9 and 10 in the pole depiction:

$$\|\vec{U}_s\| = \sqrt{U_{sd}^2 + U_{sq}^2} \quad \text{(Equation 11)}$$

$$\Theta_{Usdq} = \arctan\left(\frac{U_{sq}}{U_{sd}}\right) \quad \text{(Equation 12)}$$

Wherein Equation 12 takes all of the quadrants into account.

The second calculation of the input voltage of the machine occurs as follows, specifically via the determination of target values, which are calculated via the PWM values from a preceding sampling step $PWM_{X(k-1)}$ and the intermediate circuit voltage $U_{dc}$. Because the PWM values from the previous sampling step (k−1) can first be established at the start of the new sampling step k in the inverter 220, the rotational rate and the sampled currents for the first calculation of the voltages $U_{sdRef}$ and $U_{sqRef}$ are synchronous to the PWM values applied for the second calculation of the voltages.

The voltages $U_{sdRef}$ and $U_{sqRef}$ are calculated as follows:

$$\begin{pmatrix} U_{s\alpha Ref} \\ U_{s\beta Ref} \end{pmatrix} = \begin{pmatrix} \frac{2}{3} & -\frac{1}{3} & -\frac{1}{3} \\ 0 & \frac{1}{\sqrt{3}} & -\frac{1}{\sqrt{3}} \end{pmatrix} \begin{pmatrix} PWM1_{(k-1)} \\ PWM2_{(k-1)} \\ PWM3_{(k-1)} \end{pmatrix} \cdot U_{dc} \quad \text{(Equation 13)}$$

$$\begin{pmatrix} U_{s\alpha Ref} \\ U_{s\beta Ref} \end{pmatrix} = \begin{pmatrix} \cos\Theta_{el/Neu} & \sin\Theta_{el/Neu} \\ -\sin\Theta_{el/Neu} & \cos\Theta_{el/Neu} \end{pmatrix} \begin{pmatrix} U_{s\alpha Ref} \\ U_{s\beta Ref} \end{pmatrix} \quad \text{(Equation 14)}$$

wherein $$\Theta_{el/Neu} = \Theta_{el} + \omega_{el} \cdot \Delta T_{UOffset}, \quad \text{(Equation 15)}$$

wherein $\Delta T_{UOffset}$ is a time offset lying between zero and $T_A/2$, wherein $T_A$ represents the sampling time of the regulating system.

Analogously, the same applies for the reference voltage. The reference voltage amplitude $U_{sRef}$ and the reference voltage phase $\Theta_{UsdqRef}$ of the machine in the d, q-coordinate system are obtained from the following equations:

$$\|\vec{U}_{sRef}\| = \sqrt{U_{sdRef}^2 + U_{sqRef}^2} \quad \text{(Equation 16)}$$

$$\Theta_{UsdqRef} = \arctan\left(\frac{U_{sqRef}}{U_{sdRef}}\right). \quad \text{(Equation 17)}$$

Through the comparison of the two phase voltage indicators of the machine determined in the first and second equations, thus the phase and amplitude, it can be determined whether a malfunction has occurred.

More precisely, the phase voltage indicator of the measured phase current (Equation 11) and the phase voltage indicator of the reference value (Equation 16), as well as the phase voltage indicator of the measured rotational rate (Equation 12) and the phase voltage indicator of the reference rotational rate (Equation 17) are compared. This occurs, e.g., through the voltage comparison device 260. The Equations 2 to 8 could be calculated, for example, in a first calculating device 240, and Equation 9 and 19 could be calculated, for example, in a second calculating device 250. However, the calculation is not restricted to the shown calculating devices, but rather, the calculations could also be calculated in a single calculating device, depending on which structure has been selected for the monitoring device.

Through the comparison of the measured values with the reference values, the behavior of the machine can be determined on the basis of a voltage comparison, even if a current sensor has malfunctioned. Certain errors can be determined thereby, e.g. a phase break, winding short circuits, position errors or large parameter fluctuations. When the two compared phase voltage indicators are the same, and thus there is no deviation, then the behavior of the machine is to be regarded as being in order, always with regard to the observed error possibilities. When a deviation between the phase voltage indicators has been detected, it can be evaluated by means of an evaluation device 280. An evaluation can be carried out in different ways, e.g. through the formation of an average value, integration of the deviations over time, and other methods known to the person skilled in the art for detecting a malfunction.

For purposes of completeness, it should be noted that the control components 205 shown in FIG. 2 determine d- and q-components of a voltage on the basis of a desired overall target current through the induction machine 100, preferably based on the following Equations 18 and 19:

$$U_{sd\_k} = \left(\frac{T_I}{T+T_I}\right) \cdot U_{sd\_k-1} + \left(\frac{T+T_{Ed}}{T+T_I}\right) \cdot I_{sd\_k} \cdot R_s - \frac{T_{Ed}}{T+T_I} \cdot I_{sd\_k-1} \cdot R_s - \frac{T}{T+T_I} \cdot T_{Eq} \cdot \omega_{el} \cdot I_{sd\_k} \cdot R_s \quad \text{(Equation 18)}$$

-continued $$U_{sq\_k} = \left(\frac{T_l}{T+T_2}\right) \cdot U_{sq\_k-1} + \left(\frac{T+T_{Eq}}{T+T_2}\right) \cdot I_{sq\_k} \cdot R_s - \frac{T_{Eq}}{T+T_2} \cdot I_{sq\_k-1} \cdot R_s + \frac{T}{T+T_2} \cdot T_{Ed} \cdot \omega_{el} \cdot I_{sq\_k} \cdot R_s + \Psi_{PSd} \cdot \omega_{el}$$ (Equation 19)

The current components $I_{sd\_k}$, $I_{sq\_k}$ used in Equations 18 and 19 correspond to the current components $I_{sdRef}$, $I_{sqRef}$ of the overall target current of the induction machine 100 shown in FIG. 2, which are supplied to the current filter 270 and the control components 205 of the FOC.

Symbols used in the equations:

$\omega_{el}$ electrical angular speed
$\Theta_m$ mechanical angle
$\Theta_{el}$ electrical angle
Zp pair of pole numbers of the machine
$U_{s\alpha}$, $U_{s\beta}$ voltages in the $\alpha$, $\beta$-coordinate system
$U_{sd\_k}$, $U_{sq\_k}$ required voltages in the d, q-coordinate system (current)
$U_{sd\_k-1}$, $U_{sq\_k-1}$ required voltages in the d, q-coordinate system (one sampling step prior thereto); wherein the voltage $U_{sq\_k-1}$ is the voltage $U_{sq\_k}$ or the term $(\omega_{el} * \Psi_{PM})$
$I_{sd\_k-1}$, $I_{sq\_k-1}$ target currents $I_{sdRef}$ and $I_{sqRef}$ from prior sampling step
Rs stator resistance of the machine
$\Psi_{PM}$ revolving field flux of the machine
$T_{Ed}$ electrical time constant of the machine in the d-axis (=Lsd/R)
$T_{Eq}$ Electrical time constant of the machine in the q-axis (=Lsq/R)
$T_1$ desired time constant in the d-axis
$T_2$ desired time constant in the q-axis
$T=T_A$ applied regulator sampling time
$U_{dc}$ intermediate circuit voltage (corresponds in some applications in the automotive industry to a battery voltage)
PWM$_{1, 2, 3}$ PWM values for activating the inverter The method described above for monitoring the regulating behavior of a PSM machine when a current sensor malfunctions is obtained through comparison, i.e. subtraction of measured voltage indicators of the machine in the d, q-coordinate system from reference values. This difference between the two voltages and amplitudes can be evaluated by another device, i.e. a warning signal can be output, or a command for an immediate restart or shutting down of the machine may be issued, depending on the detected malfunction. The current of the other machine phase having a functioning current sensor is used thereby for the calculation of the current indicator, by means of the error detection device 290, referred to in Fig. as "SensFailure," depending on which phase has the malfunctioning or defective current sensor. First, the machine target currents $I_{sdRef}$ and $I_{sqRef}$ are filtered, wherein in the depiction shown, filter 1 270 is used for $I_{sdRef}$, which reflects the dynamics of the FOC in the d-axis (Equation 18), and for $I_{sqRef}$, filter 2 270 is used, which reflects the dynamics of the FOC in the q-axis (Equation 19). The load angle of the machine can be reproduced (Equation 2) with the filtered d, q-target current values. The phase of the current indicator is then determined through Equation 3, and the amplitude of the current indicator is calculated from one of the Equations 4 to 6, depending on which phase sensors are still functioning.

With the calculation of the current indicator, the currents $I_{sd}$ and $I_{sq}$ can be calculated from Equations 7 and 8, and from this, the two voltages $U_{sd}$ and $U_{sq}$ can be determined via the differential equations of the machine (Equation 9 and Equation 10). On the other hand, the reference voltages of the machine can be calculated in the d, q-coordinate system via the PWM values from the preceding sampling step (k–1), the intermediate circuit voltage of the inverter, and the electrical angle of the machine (Equation 13, Equation 14, Equation 15). In Equation 15, the electrical angle of the machine is adjusted for transformation of the voltages $U_{s\alpha}$ and $U_{s\beta}$ due to discretization errors. In the block "voltage comparison" 260 in FIG. 2, the amplitudes (Equation 11 and Equation 16) as well as phases (Equation 12 and Equation 17) of the voltage indicator, are compared, and subtracted, which is then evaluated in block "evaluation" 280. The evaluation occurs thereby as described above.

Different advantages are obtained through the present invention. In differing from prior monitoring methods, in which the use of the two diagnoses for monitoring the position sensor and the machine performance are omitted, because the necessary phase currents of the machine cannot be measured, this is of no significance for the voltage monitoring according to the invention with the FOC, i.e. the field oriented control. Due to the monitoring via voltages, a monitoring of the PSM machine can occur even when a current sensor malfunctions, wherein, as a result, more of the components of the machine can be monitored than with prior methods. By way of example, monitoring of the PSM machine can be obtained for phase failures, winding short circuits, parameter fluctuations, angle errors, etc., and thus all of the components that can be monitored by means of voltage can be monitored when a current sensor malfunctions, or when only one current sensor remains functional. In this manner, critical situations can be detected in a timely manner, and appropriate measures for eliminating the error can be taken.

With the voltage monitoring of the regulating behavior of the PSM machine according to the invention, two current sensors are sufficient for a diagnosis, such that components can be eliminated, e.g. sensors, A/D converters, printed circuit board surface area, etc., such that a savings in costs can be obtained, which is a major advantage when the production numbers range in the millions. Furthermore, voltage and power losses, attributable to the measurement device for the phase currents via a shunt resistor, can be reduced.

In summary, an effective monitoring of the machine can be ensured through the monitoring device according to the invention, even when a current sensor malfunctions, such that a longer use of the application, in which the monitoring device is incorporated, can be obtained, which can also lead to greater safety, e.g. when operated in emergency mode. A higher safety level can be obtained, e.g. when used in an electric power steering system, because when a current sensor malfunctions, there is no need for an abrupt stop, but rather, it is still possible to drive, e.g. to the next auto mechanic, or home.

LIST OF REFERENCE SYMBOLS

100 induction machine
101 rotor
102 rotational axis
103 permanent magnet
$\vec{I}_s$ current indicator, or current vector U, V, W phases
$\Psi_{PM}$ flux of the permanent magnet
$\Theta_d$ electrical rotational angle
205 control components 210 converter
215 vector modulator
220 pulse inverter
225 sampling device/current sensors
230 position sensor
240 first calculating device
250 second calculating device
260 voltage comparison device
270 filter
280 evaluation device
290 error detection device

What is claimed is:

1. A method for monitoring a PSM machine having at least or exactly three phases (U, V, W), which are operated by a field oriented control, the method comprising:
   determining whether one or more current sensors disposed on a phase of the PSM machine has malfunctioned;
   wherein if a malfunction of the current sensors is detected, such that only one of the current sensors remains functional, the method also comprises calculating a voltage indicator from a voltage amplitude and a voltage phase of an input voltage of the PSM machine in a d, q-coordinate system using the following two different calculations:
   wherein the first calculation comprises calculating the input voltage based on a phase current measured by a functioning current sensor, target currents, and an electrical angle of the PSM machine; and
   wherein the second calculation comprises calculating the input voltage based on target values of a reference voltage amplitude and a reference phase;
   determining the voltage amplitude and the voltage phase of the input voltage of the PSM machine; and
   comparing the values of the voltage amplitude and the voltage phase determined from the input voltage in the first calculation and the values of the voltage amplitude and the voltage phase determined from the input voltage in the second calculation.

2. The method of claim 1, wherein in the first calculation, the calculating of the voltage indicator from the voltage amplitude and the voltage phase of the input voltage is based on a phase of a current indicator $\Theta_I$ and a current indicator amplitude $\vec{I}_s$;
   wherein the first calculation also comprises calculating the phase of the current indicator $\Theta_I$ via a load angle $\Theta_{Last\ Ref}$ and an electrical angle $\Theta_{el}$ of the PSM machine according to the following equation:

$$\Theta_I = \Theta_{el} + \Theta_{Last\ Ref};$$

wherein the first calculation also comprises calculating the load angle of the PSM machine $\Theta_{Last\ Ref}$ from filtered currents $I_{sdRefF}$ and $I_{sqRefF}$, that are offset target values of the d, q-currents, according to the following equation:

$$\Theta_{Last\ Ref} = \arctan\frac{I_{sqRefF}}{I_{sdRefF}};$$

wherein the first calculation further comprises calculating the current indicator amplitude $\vec{I}_s$ as a function of the current indicator in a U, V, W-coordinate system $I_{su}$, $I_{sv}$, $I_{sw}$;

wherein the calculating of the current indicator amplitude $\vec{I}_s$ in phase U comprises the following equation:

$$\|\vec{I}_s\| = \frac{Isu}{\cos(\Theta I)};$$

wherein the calculating of the current indicator amplitude $\vec{I}_s$ in phase V comprises the following equation:

$$\|\vec{I}_s\| = \frac{Isv}{\cos\left(\Theta_I + \frac{4\pi}{3}\right)};$$

and
   wherein the calculating of the current indicator amplitude $\vec{I}_s$ in phase W comprises the following equation:

$$\|\vec{I}_s\| = \frac{Isw}{\cos\left(\Theta_I + \frac{2\pi}{3}\right)}.$$

3. The method of claim 1, wherein the comparing of the values of the voltage amplitudes and the voltage phases in the first and second calculations comprises subtracting the values for the voltage amplitudes and the voltage phases determined in the first and second calculations.

4. The method of claim 1, wherein when the voltage indicators from the first and second calculations are different, a deviation is detected and evaluated to identify the error.

5. The method of claim 4, wherein when the deviation is detected, the method further comprises one or more of transmitting an error signal, shutting down the PSM machine, or modifying the PSM machine parameters.

6. The method of claim 1, wherein with the second calculation, the target values of the reference voltage amplitude and reference voltage phase are calculated from a sampling of the phase current and an intermediate circuit voltage.

7. The method of claim 1, wherein the voltage amplitudes and the voltage phases of the first and second calculations are obtained through transformation of the d, q-components of the input voltage into a pole depiction.

8. An assembly for monitoring a PSM machine having at least, or exactly, three phases (U, V, W), which are operated by a field oriented control, the assembly comprising:
   one or more current sensors disposed on each phase of the PSM machine, which is configured to measure a phase current of the phase;
   a device for detecting a machine angle of the PSM machine;
   a sampling device for sampling the phase current of at least one of the phases (U, V, W),
   a device for determining whether one or more of the current sensors has malfunctioned;
   wherein if a malfunction of the current sensors is detected, such that only one of the current sensors remains functional, the device calculates a voltage indicator from a voltage amplitude and a voltage phase of an input voltage of the PSM machine in a d, q-coordinate system;

an error detection device that detects a malfunction of a current sensor or detects that only one current sensor remains functional, and sets the voltage indicator for a first calculation such that the current phase of one of the other current sensors is used.

9. The assembly of claim 8, wherein the device for determining whether one or more of the current sensors has malfunctioned also comprises (1) a device for calculating the voltage indicator using a first calculation comprising calculating the input voltage based on a phase current measured by a functioning current sensor, target currents, and an electrical angle of the PSM machine; (2) a device for calculating the voltage indictor using a second calculation comprising calculating the input voltage based on target values of a reference voltage amplitude and a reference phase; and (3) a comparison device that compares the the respective voltage indicators calculated in the first and second calculations from measured phase currents and target values.

10. The assembly of claim 9, wherein the device determining whether one or more of the current sensors has malfunctioned also comprises a device for determining the voltage amplitude and the voltage phase of the input voltage of the PSM machine and an evaluation device that identifies a detects a deviation when the voltage indicators from the first and second calculations are different and evaluates the deviations to identify the error.

11. The method of claim 2, wherein the comparing of the values of the voltage amplitudes and the voltage phases in the first and second calculations comprises subtracting the values for the voltage amplitudes and the voltage phases determined in the first and second calculations.

12. The method of claim 2, wherein the voltage indicators from the first and second calculations are different, a deviation is detected and evaluated to identify the error.

13. The method of claim 3, wherein the voltage indicators from the first and second calculations are different, a deviation is detected and evaluated to identify the error.

14. The method of claim 2, wherein with the second calculation, the target values of the reference voltage amplitude and reference voltage phase are calculated from a sampling of the phase current and an intermediate circuit voltage.

15. The method of claim 3, wherein with the second calculation, the target values of the reference voltage amplitude and reference voltage phase are calculated from a sampling of the phase current and an intermediate circuit voltage.

16. The method of claim 4, wherein with the second calculation, the target values of the reference voltage amplitude and reference voltage phase are calculated from a sampling of the phase current and an intermediate circuit voltage.

17. The method of claim 5, wherein with the second calculation, the target values of the reference voltage amplitude and reference voltage phase are calculated from a sampling of the phase current and an intermediate circuit voltage.

18. The method of claim 2, wherein the voltage amplitudes and the voltage phases of the first and second calculations are obtained through transformation of the d, q-components of the input voltage into a pole depiction.

19. The method of claim 3, wherein the voltage amplitudes and the voltage phases of the first and second calculations are obtained through transformation of the d, q-components of the input voltage into a pole depiction.

20. The method of claim 4, wherein the voltage amplitudes and the voltage phases of the first and second calculations are obtained through transformation of the d, q-components of the input voltage into a pole depiction.

* * * * *